United States Patent
Lin (10) Patent No.: US 11,424,715 B2
(45) Date of Patent: Aug. 23, 2022

(54) SOLAR ENERGY DETECTION MODULE AND SOLAR PANEL

(71) Applicant: PV GUIDER CONSULTANCY CO., LTD., Taipei (TW)

(72) Inventor: Ching-Chieh Lin, Taipei (TW)

(73) Assignee: PV GUIDER CONSULTANCY CO., LTD., Taipei (TW)

(*) Notice: Subject to any disclaimer, the term of this patent is extended or adjusted under 35 U.S.C. 154(b) by 441 days.

(21) Appl. No.: 16/654,057

(22) Filed: Oct. 16, 2019

(65) Prior Publication Data
US 2020/0127603 A1    Apr. 23, 2020

(30) Foreign Application Priority Data
Oct. 19, 2018   (CN) .......................... 201811219710.8

(51) Int. Cl.
*H02S 50/10*      (2014.01)
*G01N 21/958*     (2006.01)
*H01L 31/049*     (2014.01)
*H01L 31/048*     (2014.01)

(52) U.S. Cl.
CPC ........... *H02S 50/10* (2014.12); *G01N 21/958* (2013.01); *H01L 31/049* (2014.12); *H01L 31/0488* (2013.01)

(58) Field of Classification Search
CPC . H01L 31/0488; H01L 31/049; G01N 21/958; H02S 50/10
See application file for complete search history.

(56) References Cited

U.S. PATENT DOCUMENTS

2013/0201027 A1* 8/2013 Bucher .................. H02S 50/10
361/92

FOREIGN PATENT DOCUMENTS

| CN | 104904023 A | * | 9/2015 | ............. H01L 31/02 |
| CN | 207300399 U | * | 5/2018 | ................ G01J 1/02 |
| WO | WO2018/009064 A1 | | 1/2018 | |

* cited by examiner

*Primary Examiner* — Kevin K Pyo
(74) *Attorney, Agent, or Firm* — Schmeiser, Olsen & Watts, LLP (57) ABSTRACT

Solar energy detection module and solar panel are introduced. The solar energy detection module includes a backsheet, a first encapsulation layer, a first photovoltaic unit, a light source, a second encapsulation layer and a transparent layer. The first encapsulation layer is disposed above the backsheet. The first photovoltaic unit and the light source are disposed above the first encapsulation layer. The second encapsulation layer is disposed above the first photovoltaic unit and light source. The transparent layer is disposed above the second encapsulation layer. The light source is configured to emit light toward the transparent layer. The first photovoltaic unit is arranged to be able to receive light from the light source and generate an electrical signal indicating intensity of light that the first photovoltaic unit receives. The solar panel includes the solar energy detection module and a plurality of second photovoltaic units.

13 Claims, 9 Drawing Sheets

SOLAR ENERGY DETECTION MODULE AND SOLAR PANEL

CROSS-REFERENCE TO RELATED APPLICATION

This non-provisional application claims priority under 35 U.S.C. § 119(a) on Patent Application No(s). 2018112-19710.8 filed in People's Republic of China (PRC) on Oct. 19, 2018, the entire contents of which are hereby incorporated by reference.

BACKGROUND OF THE INVENTION

1. Field of the Invention

The present disclosure relates to solar energy detection, and in particular to a solar energy detection module and solar panel.

2. Description of the Related Art

Solar panels are currently one kind of important renewable energy devices.

In the current practice, when the solar panel is in use, the user needs to perform multiple monitoring operations in the field, or install additional equipment for detection. These monitoring operations are usually time consuming and increase the user's management burden and cost.

In addition, for a conventional design approach, if it is required to have a solar panel embedded with an additional detection device, the original structure of the solar panel, such as its physical size and shape, will have to change inevitably. For example, an additional space has to be formed in the structure of the original solar panel to accommodate a detecting device, thus increasing the thickness of the solar panel with the detecting device, wherein the additional space causes the thickness to be increased at the position of the solar panel on which the detecting device is disposed. Further, in order to form the additional space in the solar panel, it is required to change the original structure of the solar panel at the position corresponding to the additional space, for example, by locally removing or omitting active components from the structure of the original solar panel to generate the additional space. In this way, for the design and manufacturing process of the solar panel, the complexity becomes greater, and the cost increases accordingly.

Therefore, it is desirable to have improvements on the solar panel and related monitoring technology to facilitate monitoring efficiency and reduce users' management burden.

BRIEF SUMMARY OF THE INVENTION

An objective of the invention is to provide a solar energy detection module and a solar panel, which can utilize a structure with reduced complexity to provide detection, to perform monitoring for surface shading level or other monitoring, so as to facilitate detection efficiency and reduce users' management burden.

To achieve at least the above objective, a solar energy detection module, includes: a backsheet, a first encapsulation layer, a first photovoltaic unit, a light source, a second encapsulation layer, and a transparent layer. The first encapsulation layer is disposed above the backsheet. The first photovoltaic unit is disposed above the first encapsulation layer. The light source is disposed above the first encapsulation layer. The second encapsulation layer is disposed above the first photovoltaic unit and the light source. The transparent layer is disposed above the second encapsulation layer. The light source is configured to emit light toward the transparent layer. The first photovoltaic unit is arranged to be able to receive light emitted from the light source. The first photovoltaic unit is utilized to generate an electrical signal indicating intensity of light that the first photovoltaic unit receives.

In an embodiment, the light source is disposed beside at least one side of the first photovoltaic unit; the second encapsulation layer is disposed above the first encapsulation layer; the first photovoltaic unit and the light source are disposed underneath the second encapsulation layer.

In an embodiment, number of the first photovoltaic unit is plural and the light source is disposed among the first photovoltaic units.

In an embodiment, number of the light source is plural and the light sources are disposed beside at least two sides of the first photovoltaic unit.

In an embodiment, when the light source is off, the first photovoltaic unit is utilized for generating an electrical signal indicating intensity of light from outside the solar energy detection module; when the light source is on, if a surface of the transparent layer is shaded by an external thing, the first photovoltaic unit is utilized for generating an electrical signal indicating intensity of light including light reflected or scattered by the external thing on the surface of the transparent layer.

In an embodiment, the solar energy detection module further includes a detection processing unit, electrically coupled to the first photovoltaic unit and the light source, for outputting a signal indicating a surface shading level of the transparent layer, based on the electrical signal generated by the first photovoltaic unit when the light source is on.

In an embodiment, the solar energy detection module further includes a detection processing unit detection processing unit is electrically coupled to the first photovoltaic unit and the light source, for controlling turning on or off of the light source, and for outputting a signal indicating a surface shading level of the transparent layer, based on the electrical signal generated by the first photovoltaic unit when the light source is on and the electrical signal generated by the first photovoltaic unit when the light source is off.

In an embodiment, the detection processing unit further includes a signal detector and a controller. The signal detector, electrically coupled to the first photovoltaic unit, is utilized for detecting the electrical signal generated by the first photovoltaic unit to output a detection signal accordingly controller is electrically coupled to the signal detector and the light source, wherein the controller is utilized for outputting a signal indicating a surface shading level of the transparent layer, based on the detection signal outputted by the signal detector when the light source is on and the detection signal generated by the signal detector when the light source is off.

In an embodiment, the solar energy detection module further includes a detection processing unit. The detection processing unit, electrically coupled to the first photovoltaic unit and the light source, is used for controlling turning on or off of the light source, and for obtaining a value indicating a surface shading level of the transparent layer, based on the electrical signal generated by the first photovoltaic unit when the light source is on and the electrical signal generated by the first photovoltaic unit when the light source is off; wherein the detection processing unit determines an irradiance value based on the electrical signal generated by the first photovoltaic unit when the light source is off, wherein the detection processing unit further outputs an irradiance value for the transparent layer without surface shading, based on the irradiance value and the value of the surface shading level.

In an embodiment, the solar energy detection module further includes a calibration photovoltaic unit and a non-transparent layer. The calibration photovoltaic unit is disposed between the first encapsulation layer and the second encapsulation layer. The non-transparent layer is disposed above the calibration photovoltaic unit and is arranged to reflect a portion of the light emitted by the light source toward the calibration photovoltaic unit. The calibration photovoltaic unit is utilized for generating an electrical signal indicating intensity of light received by the calibration photovoltaic unit.

In an embodiment, the solar energy detection module further includes a detection processing unit. The detection processing unit, electrically coupled to the first photovoltaic unit, the calibration photovoltaic unit, and the light source, is utilized for controlling turning on or off of the light source, and for outputting a signal indicating a surface shading level of the transparent layer, based on the electrical signal generated by the first photovoltaic unit when the light source is on, the electrical signal generated by the calibration photovoltaic unit, and the electrical signal generated by the first photovoltaic unit when the light source is off.

In an embodiment, the solar energy detection module further includes a power storage unit. The power storage unit, electrically coupled to the first photovoltaic unit and the light source, is utilized for storing electricity generated by the first photovoltaic unit in a power storage mode, and providing electricity to the light source and the detection processing unit in a detection mode so as to output a signal indicating a surface shading level of the transparent layer.

To achieve at least the above objective, the invention further provides a solar panel, including a backsheet, a first encapsulation layer, a first photovoltaic unit, a plurality of second photovoltaic units, a light source, a second encapsulation layer, and a transparent layer. The first encapsulation layer is disposed above the backsheet. The first photovoltaic unit is disposed above the first encapsulation layer. The second photovoltaic units are disposed above the first encapsulation layer. The light source is disposed above the first encapsulation layer. The second encapsulation layer is disposed above the first photovoltaic unit, the second photovoltaic units, and the light source. The transparent layer is disposed above the second encapsulation layer. The light source is configured to emit light toward the transparent layer. The first photovoltaic unit is arranged to be able to receive light emitted from the light source. The first photovoltaic unit is utilized to generate an electrical signal indicating intensity of light that the first photovoltaic unit receives.

Further, in some embodiments of a solar panel, the solar panel may be implemented as including the solar energy detection module and a plurality of second photovoltaic units. The solar energy detection module, for example, may be any one of the aforementioned embodiments or combination thereof. The second photovoltaic units are disposed between the first encapsulation layer and the second encapsulation layer.

In summary, each of the above embodiments can by implemented as the solar energy detection module or the solar panel, which can utilize a structure with reduced complexity to provide detection, to perform monitoring for surface shading level of the transparent layer or other monitoring, so as to facilitate detection efficiency and reduce users' management burden.

DETAILED DESCRIPTION OF THE INVENTION

To facilitate understanding of the object, characteristics and effects of this present disclosure, embodiments together with the attached drawings for the detailed description of the present disclosure are provided.

Figure 1:
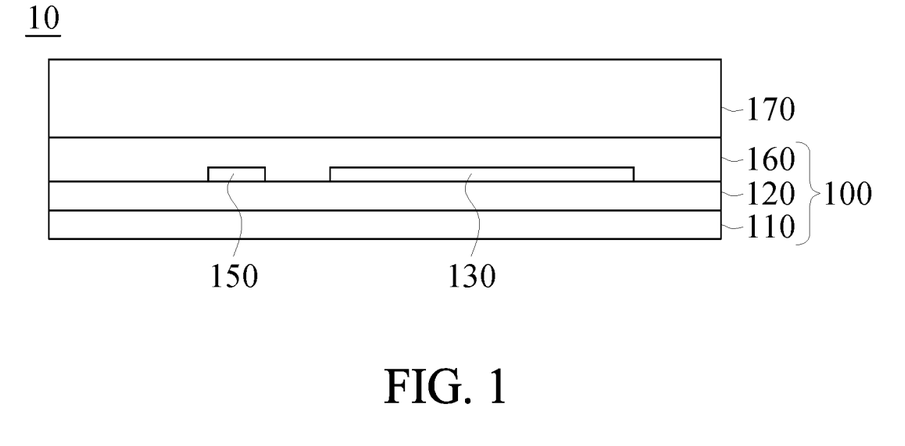
FIG. 1 is a schematic cross-sectional view illustrating a solar energy detection module according to an embodiment of the invention.

Referring to FIG. 1, a solar energy detection module is illustrated according to an embodiment of the invention in a schematic cross-sectional view. The solar energy detection module 10 can be utilized for detecting a level of shading by something external on an outer surface of the solar energy detection module 10, which may be referred to as a surface shading level, wherein something external may be dust, for example, or other things. As shown in FIG. 1, the solar energy detection module 10 includes an encapsulation portion 100, a first photovoltaic unit 130, a light source 150, and a transparent layer 170. The encapsulation portion 100 includes a backsheet 110, a first encapsulation layer 120, and a second encapsulation layer 160. The implementation of the solar energy detection module 10 or the encapsulation portion 100 is not limited to the above examples. In implementation, other layer(s) or other circuit component(s), such as a metal layer or other circuit component serving as a conductor, may be included additionally, if required.

As shown in FIG. 1, the first encapsulation layer 120 is disposed above the backsheet 110. The first photovoltaic unit 130 is disposed above the first encapsulation layer 120. The light source 150 is disposed above the first encapsulation layer 120 and beside at least one side of the first photovoltaic unit 130. The light source 150 is a light emitting diode (LED), other semiconductor light emitting component, or other light source, for example. The second encapsulation layer 160 is disposed above the first encapsulation layer 120, and the first photovoltaic unit 130 and the light source 150 are disposed underneath the second encapsulation layer 160. The transparent layer 170 is disposed above the second encapsulation layer 160. The transparent layer 170 is made of, for example, glass, organic polymer or other transparent material. The first photovoltaic unit 130 is arranged to be able to receive light from the light source 150. For example, as shown in FIG. 1, the light source 150 is disposed beside a side of the first photovoltaic unit 130 so that the light from the light source 150, at least in part, will be reflected or scattered inwards by an outer surface of the transparent layer 170, when the outer surface is shaded by something external such as dust, and thus received by the first photovoltaic unit 130, wherein the transparent layer 170 is adjacent to the light source 150. The first photovoltaic unit 130 is utilized for generating an electrical signal indicating intensity of light received by the first photovoltaic unit 130.

In addition, in another embodiment, the light source 150 may be disposed above the first photovoltaic unit 130.

In various scenarios, the light received by the first photovoltaic unit 130 may be external light such as sunlight, light of the night, or other light, or may be the above light in combination with the light from the light source 150 or other. The shading level of the outer surface of the solar energy detection module 10 can be detected by using the electrical signal generated by the first photovoltaic unit 130. The implementation of the related detection will be illustrated by way of embodiments as follows.

Figure 2:
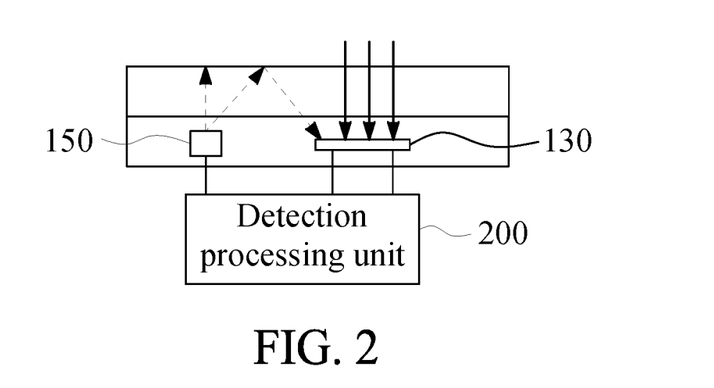
FIG. 2 is a block diagram illustrating an embodiment of the solar energy detection module having a detection processing unit.

Referring to FIG. 2, an embodiment of the solar energy detection module having a detection processing unit is illustrated in a block diagram. FIG. 2 illustrates a circuit structure, based on FIG. 1, for implementing surface shading level detection of the transparent layer 170. In the embodiment shown in FIG. 2, the solar energy detection module 10 further includes a detection processing unit 200. The detection processing unit 200 is electrically coupled to the first photovoltaic unit 130 and the light source 150 and is utilized for controlling turning on or off of the light source 150 and for outputting a signal indicating a surface shading level of the transparent layer 170, based on the electrical signal(s) generated by the first photovoltaic unit 130.

In an embodiment, the detection processing unit 200 can output a signal indicating a surface shading level of the transparent layer 170, based on the electrical signal generated by the first photovoltaic unit 130 when the light source 150 is on and the electrical signal generated by the first photovoltaic unit 130 when light source 150 is off. For example, it is supposed that there is no external thing such as dust shading the surface of the transparent layer 170, and the intensity of external light maintains at a specific level in a time interval of adjacent time (such as time within 1s, 1s or 2s or so on). In this situation, there is still difference between the electrical signal generated by the first photovoltaic unit 130 when the light source 150 is on and the electrical signal generated by the first photovoltaic unit 130 when the light source 150 is off, wherein the transparent layer 170 reflects a portion of light from the light source 150 toward the first photovoltaic unit 130 although there is no external thing shading the surface of the transparent layer 170. It is supposed that the surface of the transparent layer 170 is shaded by external things, and the intensity of external light maintains at a specific level in a time interval of adjacent time (such as time within 1s, 1s or 2s or so on). In this situation, a surface shading level of the transparent layer 170 can be indicated by the difference between the electrical signal generated by the first photovoltaic unit 130 when the light source 150 is on and the electrical signal generated by the first photovoltaic unit 130 when the light source 150 is off. If the surface shading level of the transparent layer 170 becomes greater, the light source 150 contributes more to the light received by the first photovoltaic unit 130, so that the difference between the above mentioned electrical signals, such as current signals, becomes greater. The detection processing unit 200 utilizes the difference between the electrical signals to output a signal indicating a surface shading level of the transparent layer 170. For example, the detection processing unit 200 outputs a signal for indication, which can be set, in value, from low to high (or high to low) indicating the surface shading level of 0, low, normal to high, or 0% to 100%.

However, the implementation of the present invention for the detection processing unit 200 is not limited to the above examples. In some embodiments, during a time interval (e.g., within 1s, is or 2s or so on), the detection processing unit 200 can control the light source 150 alternately turning on and off, and detect the electrical signals that the first photovoltaic unit 130 generates correspondingly while the light source 150 is turned on and off, and accordingly obtain an average value of the electrical signals corresponding to the turning on and off of the light source 150 by way of a statistical approach. Thus, the detection processing unit 200 outputs a signal indicating a surface shading level of the transparent layer 170 according to the average value. In the above embodiment of detection of the surface shading level of the transparent layer 170, the difference between the electrical signals corresponding to the turning on and off of the light source 150 may be indicated by way of subtraction or ratio of two electrical signals, or may be indicated by a function of the two electrical signals.

In another embodiment, in situations with no external light source, such as in a scenario of darkness or outdoor at night, the electrical signal generated by the first photovoltaic unit 130 when the light source 150 is on can indicate a surface shading level of the transparent layer 170. In the scenario of outdoor at night, when the light source 150 has sufficient intensity compared to ambient light, the ambient light received by the first photovoltaic unit 130 can be ignored because the ambient light is weaker than the light source 150 in light intensity.

In the following, two groups of embodiments regarding detection of the surface shading level of the transparent layer 170 will be provided so as to illustrate various implementations. The two groups of embodiments, as indicated in TABLE 1 and TABLE 2, have tests under the configuration of FIG. 1 and FIG. 2. In the configuration of these embodiments, a number of light sources 150, i.e., at least two light sources 150, are disposed on two sides of the first photovoltaic unit 130.

In the first group of embodiments indicated in TABLE 1, a number of tests are performed in darkness, with respective measurements as follows. As indicated in test 1 of TABLE 1, the detection processing unit 200 is employed to measure the current of the first photovoltaic unit 130 while the light source 150 is off, under the conditions that there is dark ambient illumination and no dust shading occurs. As indicated in test 2 of TABLE 1, the detection processing unit 200 is employed to measure the current of the first photovoltaic unit 130 while the light source 150 is on, under the conditions that there is dark ambient illumination and no dust shading occurs. As indicated in tests 3 or 4 of TABLE 1, the detection processing unit 200 is employed to measure the current of the first photovoltaic unit 130 while the light source 150 is off, under the conditions that there is dark ambient illumination and different kinds of dust shading occur.

TABLE 1

| Test | Light source | First photovoltaic unit (mA) | Difference between currents when the light source is on and off | Difference with respect to no dust shading | Simulation of dust shading |
|---|---|---|---|---|---|
| 1 | Off | 0 | — | — | No |
| 2 | On | 26.4 | 26.4 | — | No |
| 3 | On | 28.7 | 28.7 | 2.3 | Partial shading |
| 4 | On | 31.1 | 31.1 | 4.7 | Full shading |

As shown in Table 1, for each time of measurement, the difference in current of the first photovoltaic unit 130 when the light source 150 is turned on and off can be stored, and the surface shading level of the transparent layer 170 can be estimated accordingly. For example, under the condition that there is no dust shading, when the light source 150 is turned on, the difference in current of the first photovoltaic unit 130 when the light source 150 is turned on and off, for example, is 26.4 mA, wherein the difference in current may be set as a value by subtraction of two current values. Under the condition of partial dust shading, the difference in current of the first photovoltaic unit 130 when the light source 150 is turned on and off is 28.7 mA. Under the condition of full dust shading, the difference in current of the first photovoltaic unit 130 when the light source 150 is turned on and off is 31.1 mA. It can be observed that the current of the first photovoltaic unit 130 is highly correlated with the surface shading level in darkness, according to the changing trend in the difference in current of the first photovoltaic unit 130 when the light source 150 is turned on and off, as indicated in TABLE 1.

In addition, as shown in Table 1, for each time of measurement when the light source 150 is turned on, the difference between a measured current value of the first photovoltaic unit 130 and the current value of that without dust shading can be stored, and can be employed to generate a value indicating the surface shading level of the transparent layer 170 accordingly. As indicated in TABLE 1, the difference between the measured current value in the test 3 and the current value without dust shading is 2.3 mA; the difference between the measured current value in the test 4 and the current value for no dust shading is 4.7 mA. It can be observed that the current of the first photovoltaic unit 130 is highly correlated with the surface shading level in darkness, according to the changing trend in the difference between the measured current value of the first photovoltaic unit 130 and the current value of that without dust shading, as indicated in TABLE 1 under the condition that the light source 150 is turned on.

According to the embodiments indicated in TABLE 1, the detection processing unit 200 can be configured to obtain a value indicating a surface shading level, or referred to as shading rate, of the transparent layer 170, based on measured values obtained under the conditions that there is dark ambient illumination and different kinds of dust shading occur. As can be observed from TABLE 1, if, in darkness, the corresponding current of the first photovoltaic unit 130 when the light source 150 is off is zero or falls within a negligible range (such as a tolerable error range), the shading rate can be estimated by using the corresponding current value of the first photovoltaic unit 130 when the light source 150 is on, without the need of using the corresponding current value of the first photovoltaic unit 130 when the light source 150 is off as a reference value for comparison. If, in darkness, the corresponding current of the first photovoltaic unit 130 when the light source 150 is off is not zero or exceeds a negligible range (such as exceeding an error range which is tolerable), the corresponding current value of the first photovoltaic unit 130 when the light source 150 is off can be taken as a reference value for comparison.

In the second group of embodiments indicated in TABLE 2, a number of tests are performed in sunlight, with respective measurements as follows. As indicated in test 1 of TABLE 2, the detection processing unit 200 is employed to measure the current of the first photovoltaic unit 130 while the light source 150 is off under the condition that there is sunlight ambient illumination and no dust shading occurs; as indicated in test 2 of TABLE 2, the detection processing unit 200 is employed to measure the current of the first photovoltaic unit 130 while the light source 150 is on under the same conditions. As indicated in test 3 of TABLE 2, the detection processing unit 200 is employed to measure the current of the first photovoltaic unit 130 while the light source 150 is off, under the condition that there is sunlight ambient illumination and a less amount of dust shading occurs; as indicated in test 4 of TABLE 2, the detection processing unit 200 is employed to measure the current of the first photovoltaic unit 130 while the light source 150 is on under the same conditions. After that, as indicated in tests 5 and 6 of TABLE 2, the tests 3 and 4 of TABLE 2 are repeated under the condition that there is sunlight ambient illumination and a greater amount of dust shading occurs. As indicated in tests 7 and 8 of TABLE 2, the tests 3 and 4 of TABLE 2 are repeated under the condition that there is sunlight ambient illumination and full dust shading occurs.

TABLE 2

| Test | Light source | First photovoltaic unit (mA) | Ratio between currents when the light source is on and off | Difference with respect to no dust shading | Simulation of dust shading |
|---|---|---|---|---|---|
| 1 | Off | 100.1 | 1.27 | — | No |
| 2 | On | 127.5 | | | |
| 3 | Off | 63.8 | 1.45 | 0.18 | less amount of shading |
| 4 | On | 92.5 | | | |
| 5 | Off | 50.8 | 1.54 | 0.27 | Great |

TABLE 2-continued

| Test | Light source | First photovoltaic unit (mA) | Ratio between currents when the light source is on and off | Difference with respect to no dust shading | Simulation of dust shading |
|---|---|---|---|---|---|
| 6 | On | 78.2 | | | amount of shading |
| 7 | Off | 36.6 | 1.78 | 0.51 | Full shading |
| 8 | On | 65 | | | |

As shown in Table 2, for each time of measurement, the difference in current of the first photovoltaic unit 130 when the light source 150 is turned on and off can be stored, and the surface shading level of the transparent layer 170 can be estimated accordingly. For example, under the condition that there is no dust shading, the difference in current of the first photovoltaic unit 130 when the light source 150 is turned on and off, for example, is 1.27 (i.e., 127.5/100.1), wherein the difference in current may be set as a value of the ratio of the two current values. Under the condition of a less amount of dust shading, the difference in current of the first photovoltaic unit 130 when the light source 150 is turned on and off is 1.45 (such as ratio of the two current values). Under the condition that there is a greater amount of dust shading, the difference in current of the first photovoltaic unit 130 when the light source 150 is turned on and off is 1.54 (such as ratio of the two current values). Under the condition that full dust shading occurs, the difference in current of the first photovoltaic unit 130 when the light source 150 is turned on and off is 1.78 (such as ratio of the two current values). It can be observed that, in sunlight, the difference in current of the first photovoltaic unit 130 when the light source 150 is turned on and off, or a functional relationship based on the two current values, is highly correlated with the surface shading level, according to the changing trend in the difference in current of the first photovoltaic unit 130 when the light source 150 is turned on and off under each kind of dust shading conditions, as indicated in TABLE 2.

In addition, the difference in current of the first photovoltaic unit 130 when the light source 150 is turned on and off under each kind of dust shading conditions and the difference corresponding to the condition of no dust shading, as shown in Table 2, can be stored, and a value indicating the surface shading level of the transparent layer 170 can be generated accordingly. As indicated in TABLE 2, the difference (such as subtraction of two difference values) between the difference in current of the first photovoltaic unit 130 when the light source 150 is turned on and off under the condition of a less amount of dust shading according to the tests 3 and 4 and the difference corresponding to the condition of no dust shading is 0.18 (i.e., 1.45−1.27=0.18). The difference between the difference in current of the first photovoltaic unit 130 when the light source 150 is turned on and off under the condition that there is a greater amount of dust shading according to the tests 5 and 6 and the difference corresponding to the condition of no dust shading is 0.27 (i.e., 1.54−1.27=0.27). The difference between the difference in current of the first photovoltaic unit 130 when the light source 150 is turned on and off under the condition of full dust shading according to the tests 7 and 8 and the difference corresponding to the condition of no dust shading is 0.50 (i.e., 1.78−1.27=0.51). It can be observed that, in sunlight, the difference in current of the first photovoltaic unit 130 when the light source 150 is turned on and off, or a functional relationship based on the two current values, is highly correlated with the surface shading level, according to the changing trend in the difference between the difference in current of the first photovoltaic unit 130 when the light source 150 is turned on and off under each kind of dust shading conditions and the difference corresponding to the condition of no dust shading, as indicated in TABLE 2. The above functional relationship may be defined by a function of the currents (or corresponding electrical signals) of the first photovoltaic unit 130 when the light source 150 is turned on and off, or a formula of regression analysis obtained by using a statistical approach.

By way of the embodiments of TABLE 2, the detection processing unit 200 can be implemented to utilize the measurement data obtained under different dust shading conditions and the sunlight ambient illumination to derive a value indicating the surface shading level of the transparent layer 170.

In some embodiments, the detection processing unit 200 may be implemented to perform the computation of the difference in corresponding current values and the shading level by using analog circuits, such as an operational amplifier or other comparison circuit. In some embodiments, the detection processing unit 200 may also be implemented to perform the computation of the difference in corresponding current values and the shading level by using digital circuits, such as logic circuits, programmable circuits such as microprocessors and so on. Alternatively, the detection processing unit 200 may be implemented by using analog and digital circuits. In addition, in some embodiments, the detection processing unit 200 may be implemented to be adaptable to different scenarios, for example, under ambient illumination in darkness or sunlight, by way of different judging conditions, as indicated in the embodiments of TABLE 1 or 2.

Figure 3:
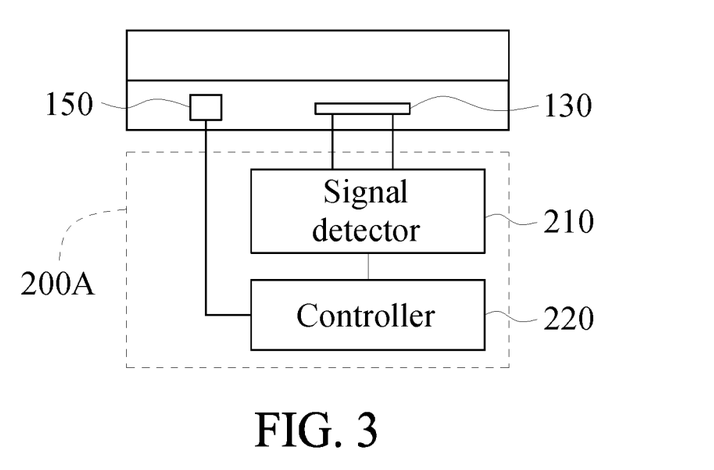
FIG. 3 is a block diagram illustrating an embodiment based on the solar energy detection module of FIG. 2.

Referring to FIG. 3, an embodiment based on the solar energy detection module of FIG. 2 is illustrated in a block diagram form. As shown in FIG. 3, the detection processing unit 200A is an embodiment of the detection processing unit 200, and includes a signal detector 210 and a controller 220. The signal detector 210 is electrically coupled to the first photovoltaic unit 130 and detects the electrical signal generated by the first photovoltaic unit 130 to output a detection signal accordingly. The controller 220 is electrically coupled to the signal detector 210 and the light source 150 and is utilized for outputting a signal indicating a surface shading level of the transparent layer 170, based on the detection signal outputted by the signal detector 210 when the light source 150 is on and the detection signal 210 generated by the signal detector when the light source 150 is off. The signal detector 210 may be implemented by using a current detector, a voltage detector, or any other detection circuit; the controller 220 may be a microcontroller, microprocessor, signal processor or so on, for example. The present embodiment may be implemented by referring to the above or any embodiment with appropriate modification.

In addition, in some embodiments, the detection processing unit 200 may be implemented by using analog circuit devices, digital circuit devices, or a combination thereof, such as comparators, amplifiers, buffers, switches or logic circuits, or a combination thereof.

In some embodiments of the detection processing unit 200, the detection processing unit 200 may further include a data transmission unit for transmitting, in a wired or wireless manner, a signal related to a state of the solar energy detection module 10, such as a signal indicating a surface shading level of the transparent layer 170, to an external device so as to facilitate monitoring, logging or statistical computation in a remote side. The data transmission unit may be a data transmission module, for example, a related chip, which supports a wireless communication protocol, such as Bluetooth® (BT), Bluetooth Low Energy (BLE), ZigBee low-power wide area network (LPWAN) or other. In addition, the detection processing unit 200, in part or in full, may also be implemented as a chip. For example, the controller 220 may be implemented as a chip including a control circuit and the data transmission unit.

In the following, various embodiments of the structure based on the solar energy detection module of FIG. 1 are provided.

Figure 4:
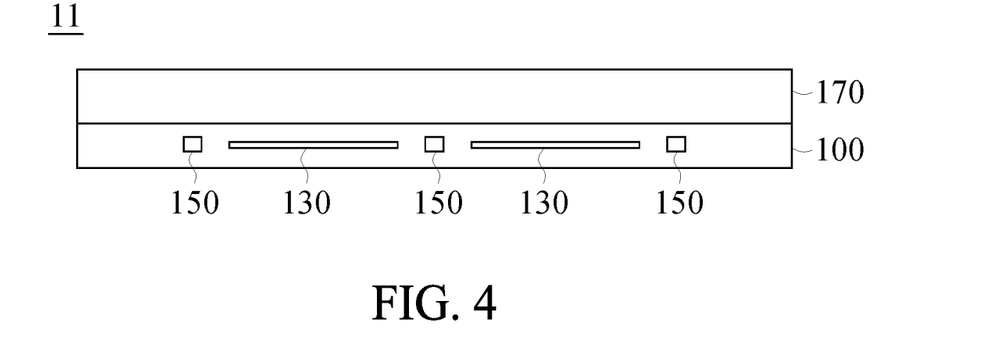
FIG. 4 is a schematic cross-sectional view illustrating an embodiment based on the solar energy detection module of FIG. 1.
Figure 5:
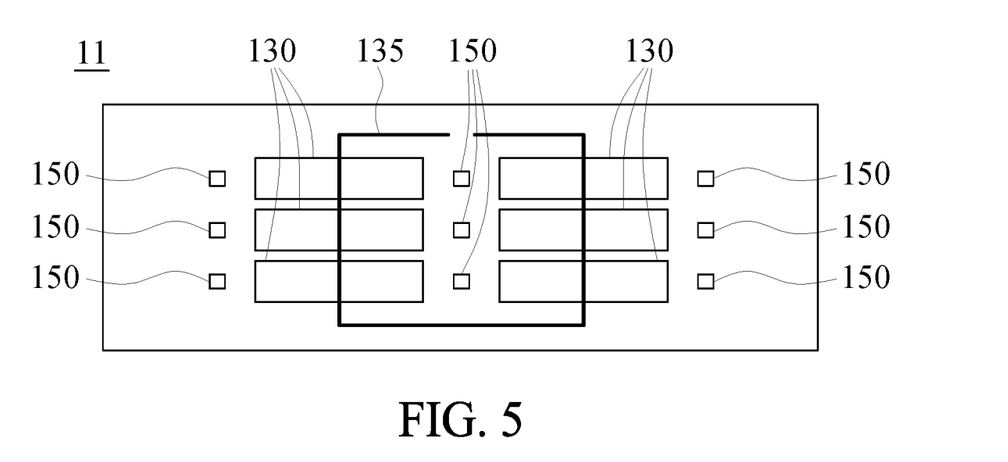
FIG. 5 is a schematic top view illustrating the internal structure of the solar energy detection module of FIG. 4.

In an embodiment, the number of the first photovoltaic unit 130 is plural and the light source 150 can be disposed among the first photovoltaic units 130. In another embodiment, the number of the light source 150 is plural and the light sources 150 can be disposed beside at least two sides of the first photovoltaic unit 130. For example, referring to FIG. 4, the solar energy detection module 11 is an embodiment based on the solar energy detection module 10 of FIG. 1. Referring to FIG. 5, the internal structure of the solar energy detection module 11 is illustrated in a schematic top view. As shown in FIG. 4 and FIG. 5, the solar energy detection module 11 includes a plurality of first photovoltaic units 130 and a plurality of light sources 150. The first photovoltaic units 130 may be electrically coupled in series, in parallel, or in series and parallel, by using a conductor 135, wherein the conductor 135 may be implemented by disposition of a metal layer or any appropriate conducting layer in the encapsulation portion 100.

Figure 6:
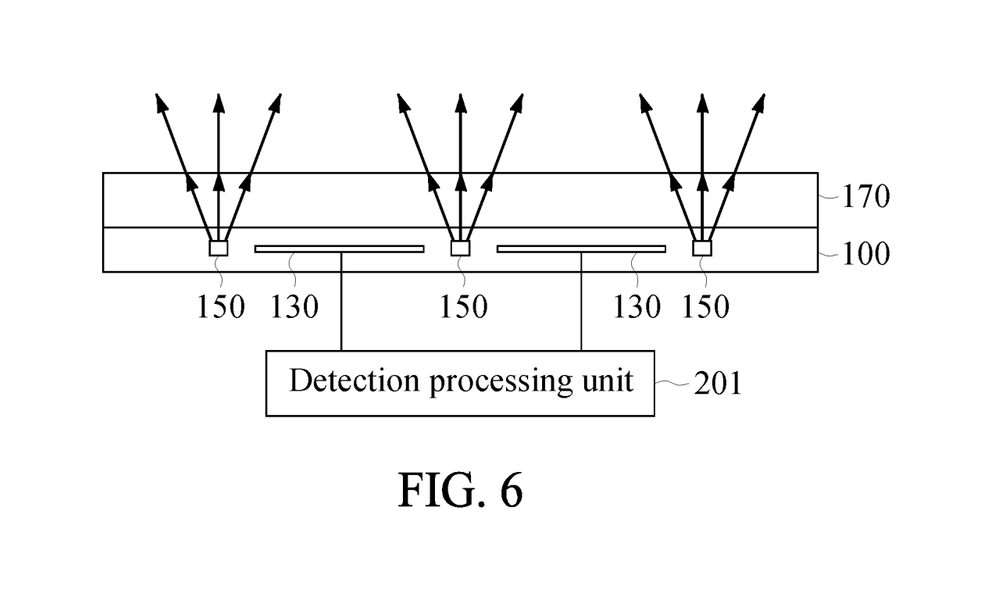
FIG. 6 is a schematic diagram illustrating the solar energy detection module of FIG. 4 to perform surface shading level detection.
Figure 7:
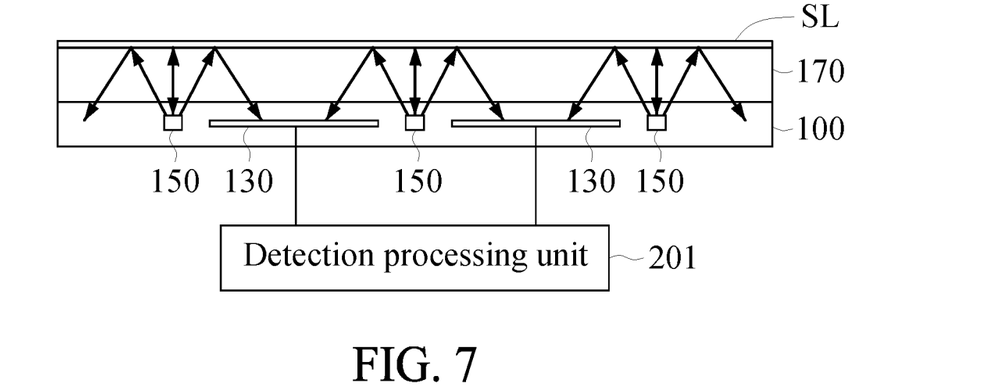
FIG. 7 is a schematic diagram illustrating the solar energy detection module of FIG. 4 to perform surface shading level detection.

Referring to FIG. 6 and FIG. 7, the solar energy detection module 11 is illustrated to perform surface shading level detection. In the embodiment, the solar energy detection module 11 may include a detection processing unit 201 to perform the detection. As shown in FIG. 6, the light sources 150 are disposed beside two sides of the first photovoltaic units 130, and thus when the light sources 150 is turned on, the light sources 150 emit light to a surface of the transparent layer 170 to a greater extent or area than that the light source 150 of FIG. 2 does, so as to facilitate the effectiveness of the surface shading level detection. As shown in FIG. 7, the first photovoltaic units 130 are arranged to be adjacent to the light sources 150 so that the light emitted by the light source 150 can be reflected or scattered by something external (indicated by SL) on the surface of the transparent layer 170 and thus received by the first photovoltaic unit 130 as the light sources 150 are turned on and the surface of the transparent layer 170 adjacent to the light sources 150 is shaded by the external thing SL. The detection processing unit 201 may be implemented as the detection processing unit 200 or 200A, and the detection processing unit 201 may be electrically coupled to the light sources 150 and control the turning on and off of the light sources 150. For example, according to an approach from one of the above related embodiments, the detection processing unit 201 outputs a signal indicating a surface shading level of the transparent layer 170, based on the electrical signals generated by the first photovoltaic units 130 when the light sources 150 are turned on and the electrical signals generated by the first photovoltaic units 130 when light sources 150 are turned off. In another embodiment, the detection processing unit 201 may be implemented to include the above-mentioned signal detector 210; and the turning on and off of the light sources 150 may be realized by another approach, such as configuring additional switch elements for the same purpose.

Figure 8:
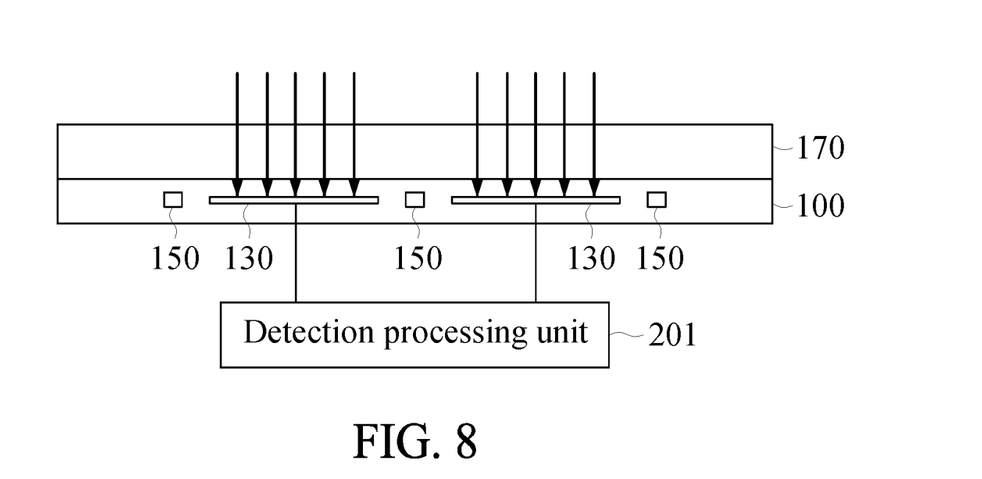
FIG. 8 is a schematic diagram illustrating sunlight detection of the solar energy detection module of FIG. 4.

Referring to FIG. 8, the solar energy detection module of FIG. 4 is illustrated to perform sunlight detection in a schematic diagram. In this embodiment, when the light sources 150 are turned off, the first photovoltaic unit 130 can be utilized to generate an electrical signal indicating the intensity of light outside the solar energy detection module, so that the electrical signal can be utilized for ambient illumination monitoring. In addition, in a situation that the solar energy detection module is in sunlight, the detection processing unit 201 can be implemented to output a sunlight irradiance value based on one or more electrical signals generated by one or more first photovoltaic units 130 when the light sources 150 are turned off, so that the solar energy detection module may be used in sunlight detection. In a situation that the solar energy detection module is in sunlight, if the surface of the transparent layer 170 is shaded by something external (such as dust), the irradiance value detected by the detection processing unit 201 is the "irradiance value affected by shading" (or referred to as a first irradiance value); if the surface of the transparent layer 170 is not shaded by the external thing, the irradiance value detected by the detection processing unit 201 is the "irradiance value without shading" (or referred to as a second irradiance value). In some embodiments, in a situation that the surface of the transparent layer 170 is shaded by the external thing, the shading rate can be obtained by using the detection processing unit 201 according to the above embodiment of computation of a value indicating the surface shading level (or shading rate) and the irradiance value without shading can be determined or estimated based on the shading rate and the measured irradiance value affected by shading. For example, the "irradiance value without shading" may be set to be a function at least based on the "irradiance value affected by shading" and "shading rate", as expressed by a formula: "irradiance value without shading"="irradiance value affected by shading"/(1−"shading rate"), wherein the "shading rate" is a value between 0 to 1. However, the computation of the "irradiance value without shading" is not limited to the above example, and such computation can be based on another function, a regression formula according to statistical data (such as TABLE 1 and 2), or so on. Hence, the solar energy detection module may be configured to realize one, two or more kinds of different monitoring functions, as indicated in the embodiments of FIG. 6 to FIG. 8 or other related embodiments.

Figure 9:
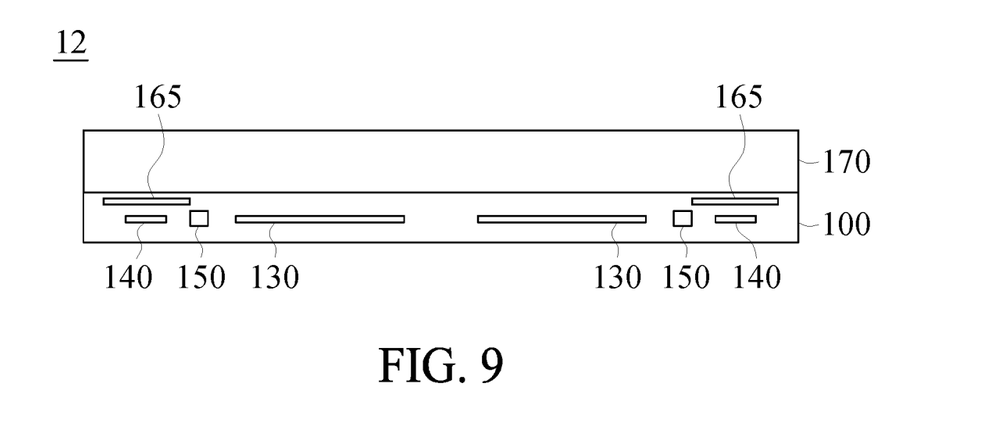
FIG. 9 is a schematic cross-sectional view illustrating another embodiment based on the solar energy detection module of FIG. 1.
Figure 10:
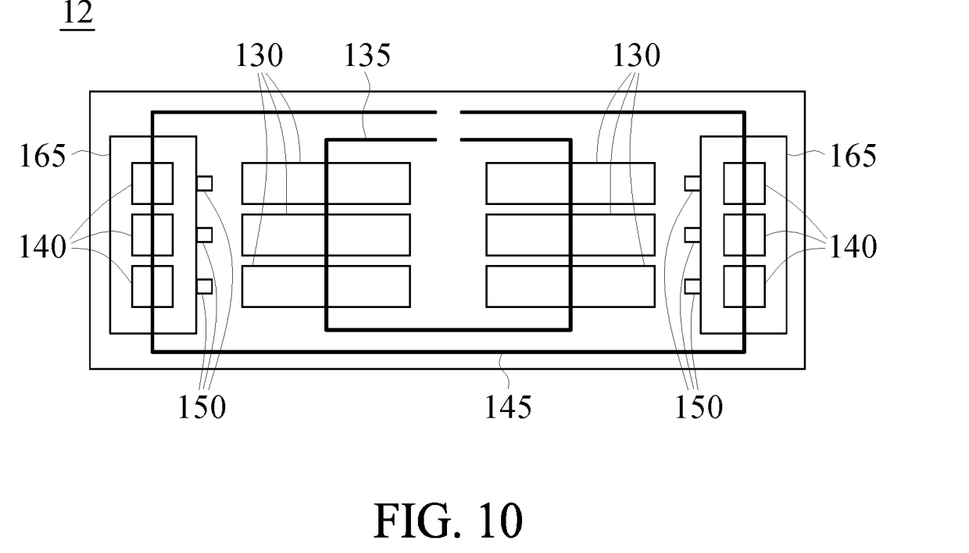
FIG. 10 is a schematic bottom view illustrating the internal structure of the solar energy detection module of FIG. 9.

Referring to FIG. 9, another embodiment based on the solar energy detection module of FIG. 1 is illustrated in a cross-sectional view. Referring to FIG. 10, the internal structure of the solar energy detection module of FIG. 9 is illustrated in a schematic bottom view. As shown in FIG. 9, a solar energy detection module 12 is an embodiment based on the solar energy detection module 10 of FIG. 1, and includes a structure for self-calibration. In this embodiment, the solar energy detection module 12 includes in addition to a plurality of first photovoltaic units 130 and a plurality of light sources 150, but also a calibration photovoltaic unit 140 and a non-transparent layer 165. The calibration photovoltaic unit 140 is disposed between the first encapsulation layer 120 and the second encapsulation layer 160, and is utilized for receiving light reflected by the non-transparent layer 165. The non-transparent layer 165 is disposed above the calibration photovoltaic unit 140, and is arranged to reflect a portion of light emitted by the light source 150 to the calibration photovoltaic unit 140. The non-transparent layer 165, for example, may be disposed within the encapsulation portion 100 of the solar energy detection module 12, such as the non-transparent layer 165 being disposed within the second encapsulation layer 160 above the calibration photovoltaic unit 140; the non-transparent layer 165 may be disposed between the second encapsulation layer 160 and the transparent layer 170; the non-transparent layer 165 may be disposed within the transparent layer 170; or the non-transparent layer 165 may be disposed on an surface of the transparent layer 170. The calibration photovoltaic unit 140 is employed to generate an electrical signal indicating intensity of light received by the calibration photovoltaic unit 140. The electrical signal outputted by the calibration photovoltaic unit 140 can be used as a reference value for self-calibration because the calibration photovoltaic unit 140 is disposed within the encapsulation portion 100 of the solar energy detection module 12, regardless of dust or so on. The first photovoltaic units 130 may be electrically coupled in series, in parallel, or in series and parallel, by using a conductor 135, wherein the conductor 135 may be implemented by disposition of a metal layer or any appropriate conducting layer in the encapsulation portion 100. The calibration photovoltaic units 140 may be electrically coupled in series, in parallel, or in series and parallel, by using a conductor 145, wherein the conductor 145 may be implemented by disposition of a metal layer or any appropriate conducting layer in the encapsulation portion 100.

Figure 11:
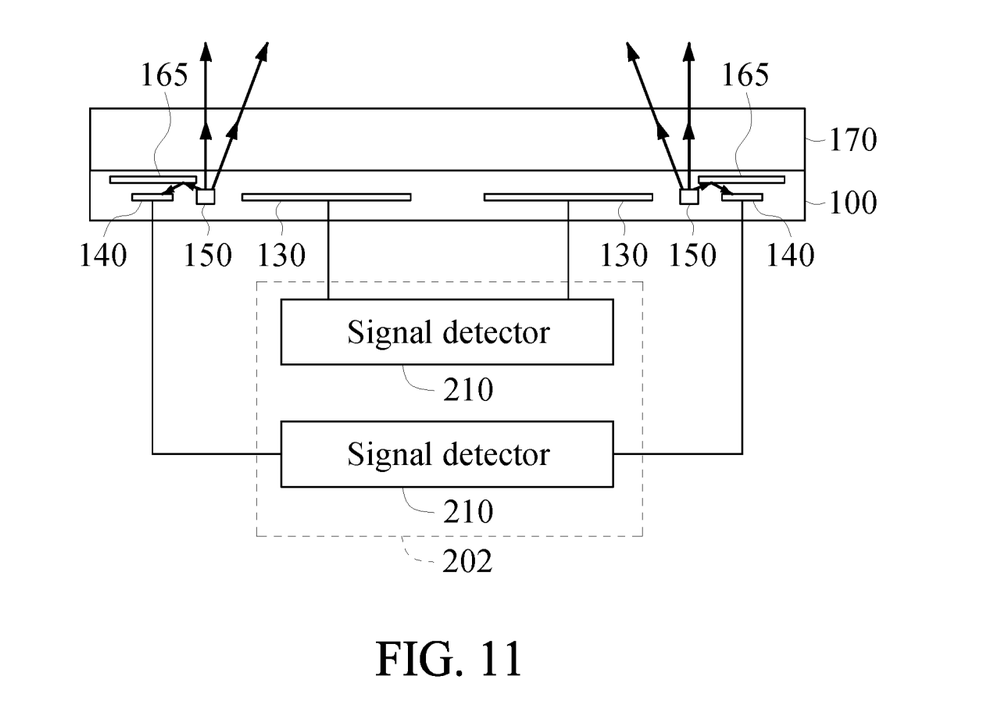
FIG. 11 is a schematic diagram illustrating the solar energy detection module of FIG. 9 to perform surface shading level detection.
Figure 12:
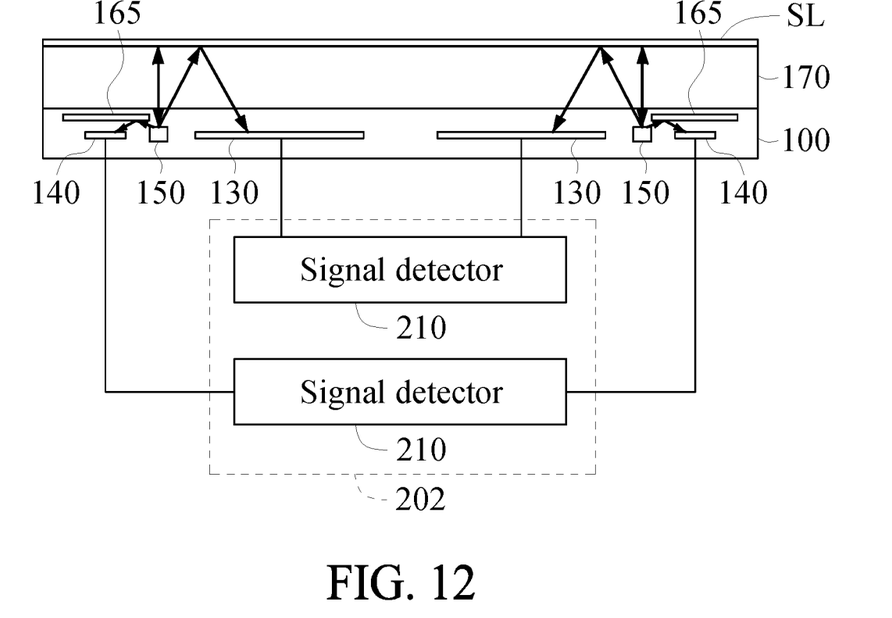
FIG. 12 is a schematic diagram illustrating the solar energy detection module of FIG. 9 to perform surface shading level detection.

Referring to FIG. 11 and FIG. 12, the solar energy detection module of FIG. 9 is illustrated to perform surface shading level detection in a schematic diagram. In this embodiment, the solar energy detection module 12 may include a detection processing unit 202 to perform the detection. The calibration photovoltaic unit 140 is utilized for generating an electrical signal indicating intensity of light received by the calibration photovoltaic unit 140. The detection processing unit 202 may be implemented as the above-mentioned detection processing unit 200 or 200A, and the detection processing unit 202 may be implemented to be electrically coupled to the light sources 150 and control the turning on and off of the light sources 150. For example, according to an approach from one of the above related embodiments, the detection processing unit 202 is electrically coupled to the first photovoltaic unit 130, the calibration photovoltaic unit 140, and the light source 150, for controlling turning on or off of the light source 150, and for outputting a signal indicating a surface shading level of the transparent layer 170, based on the electrical signal generated by the first photovoltaic unit 130 when the light source 150 is on, the electrical signal generated by the calibration photovoltaic unit 140, and the electrical signal generated by the first photovoltaic unit 130 when the light source 150 is off.

In another embodiment, the detection processing unit 202 may be implemented to include the above-mentioned signal detector 210. As shown in FIG. 11 and FIG. 12, one signal detector 210 can be electrically coupled to the first photovoltaic units 130 to output a first detection signal, and another signal detector 210 can be electrically coupled to the calibration photovoltaic units 140 to output a second detection signal, wherein the second detection signal can be utilized in correction for changes of the light source 150 due to degradation. In addition, the turning on and off of the light sources 150 may be realized by another approach, such as configuring additional switch elements for the same purpose.

Figure 13:
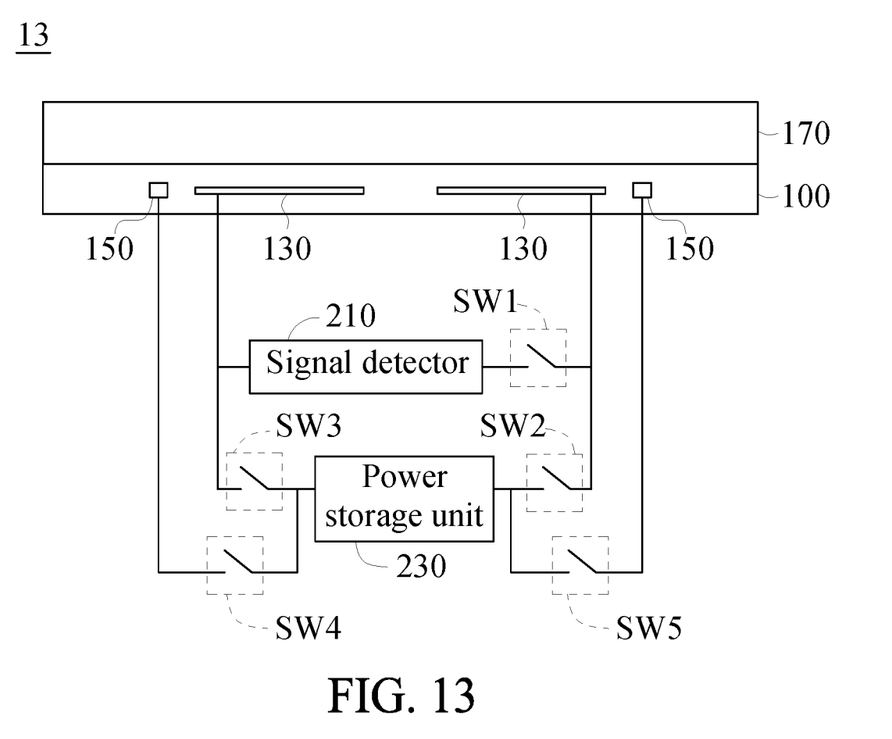
FIG. 13 is a schematic diagram illustrating an embodiment of the solar energy detection module having a power storage unit.

Referring to FIG. 13, an embodiment of the solar energy detection module having a power storage unit is illustrated in a schematic diagram. As shown in FIG. 13, a solar energy detection module 13 is an embodiment based on FIG. 4. In the present embodiment, the solar energy detection module 13 further includes a power storage unit 230. The power storage unit 230 may include, for example, a power storage component, such as a chargeable battery; or may further include a related power component or circuit, such as a regulator. The power storage unit 230 is electrically coupled to the first photovoltaic units 130 and the light sources 150, and is utilized for storing electricity generated by the first photovoltaic units 130 and powering the light sources 150. In an embodiment, the power storage unit 230 is electrically coupled to the first photovoltaic units 130 and the light sources 150 through switch elements, and for storing electricity generated by the first photovoltaic unit 130 in a power storage mode, and powering the light source 150 and the detection processing unit (such as 200 of FIG. 2 or 200A of FIG. 3) or controller (such as 220 of FIG. 3) in a detection mode so as to output a signal indicating a surface shading level of the transparent layer 170. In the power storage mode, the switch elements SW2 and SW3 are turned on, the switch elements SW1, SW4, SW5 are turned off. In the detection mode, the switch elements SW1, SW4, SW5 are turned on, the switch elements SW2 and SW3 are turned off. However, the implementation of the invention is not limited to the above examples.

In some embodiments, any one or combination of the embodiments of the solar energy detection module can be integrated into the solar panel. The solar panel may include a backsheet, a first encapsulation layer, a first photovoltaic unit, a plurality of second photovoltaic units, a light source, a second encapsulation layer, a transparent layer. The first encapsulation layer is disposed above the backsheet. The first photovoltaic unit is disposed above the first encapsulation layer. The second photovoltaic units are disposed above the first encapsulation layer. The light source is disposed above the first encapsulation layer and beside at least one side of the first photovoltaic unit. The second encapsulation layer is disposed above the first encapsulation layer, and the first photovoltaic unit, the second photovoltaic units and the light source are disposed underneath the second encapsulation layer. The transparent layer is disposed above the second encapsulation layer. The light source is configured to emit light toward the transparent layer. The first photovoltaic unit is arranged to be able to receive light emitted by the light source. The first photovoltaic unit is utilized to generate an electrical signal indicating intensity of light that the first photovoltaic unit receives. The second photovoltaic units are employed to generate electrical signals for providing electricity.

Figure 14:
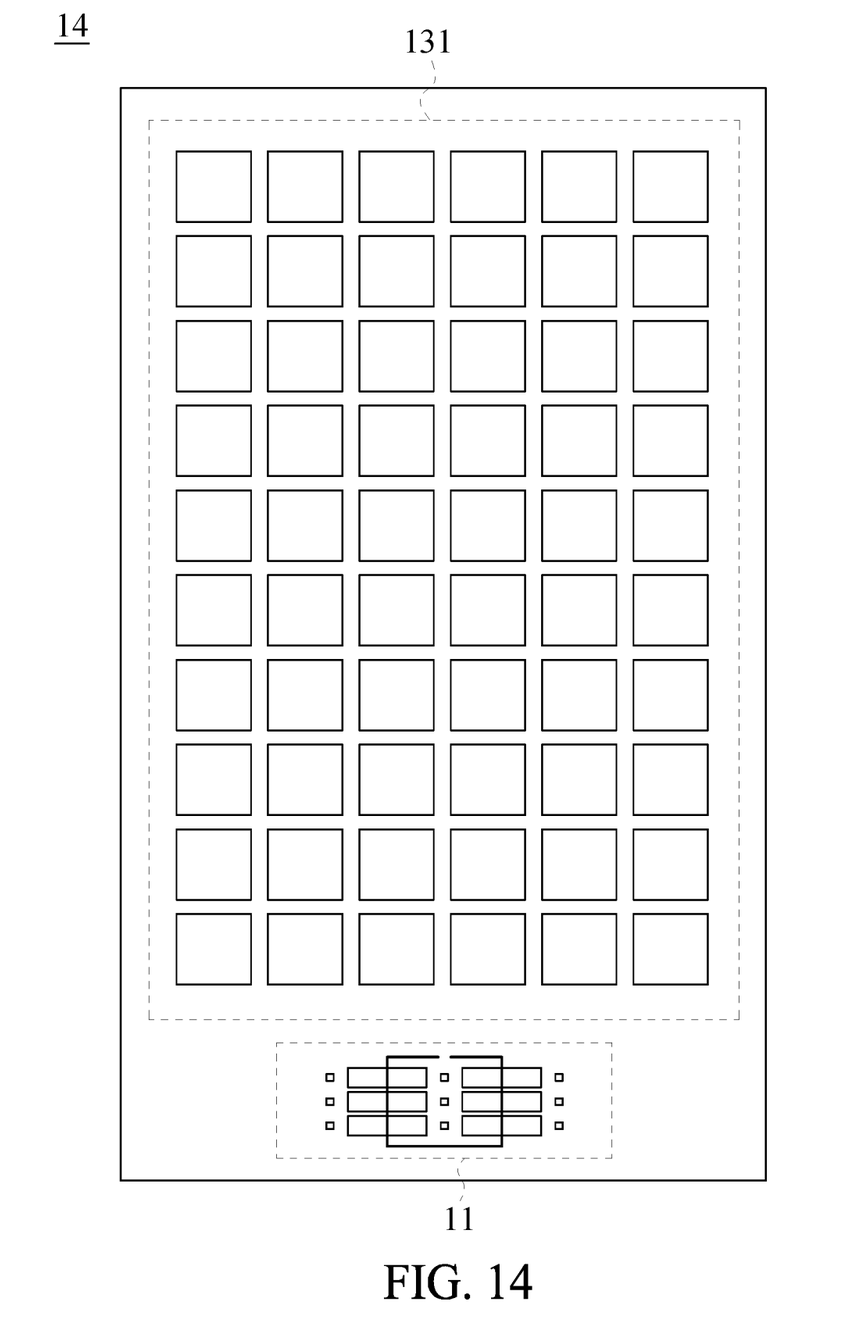
FIG. 14 is a schematic diagram illustrating an embodiment of a solar panel having a solar energy detection module.

Referring to FIG. 14, an embodiment of a solar panel 14 having a solar energy detection module is illustrated in a schematic diagram. The embodiment of the solar panel 14 includes a structure similar to the solar energy detection module 11 (or 10, 12, or 13) and a plurality of second photovoltaic units 131. The solar energy detection module 11 includes an encapsulation portion 100, a plurality of first photovoltaic units 130, a plurality of light sources 150, and a transparent layer 170, as shown in FIG. 4 or FIG. 5. The second photovoltaic units 131 are disposed in the encapsulation portion 100, for example, between the first encapsulation layer 120 and the second encapsulation layer 160.

Figure 15:
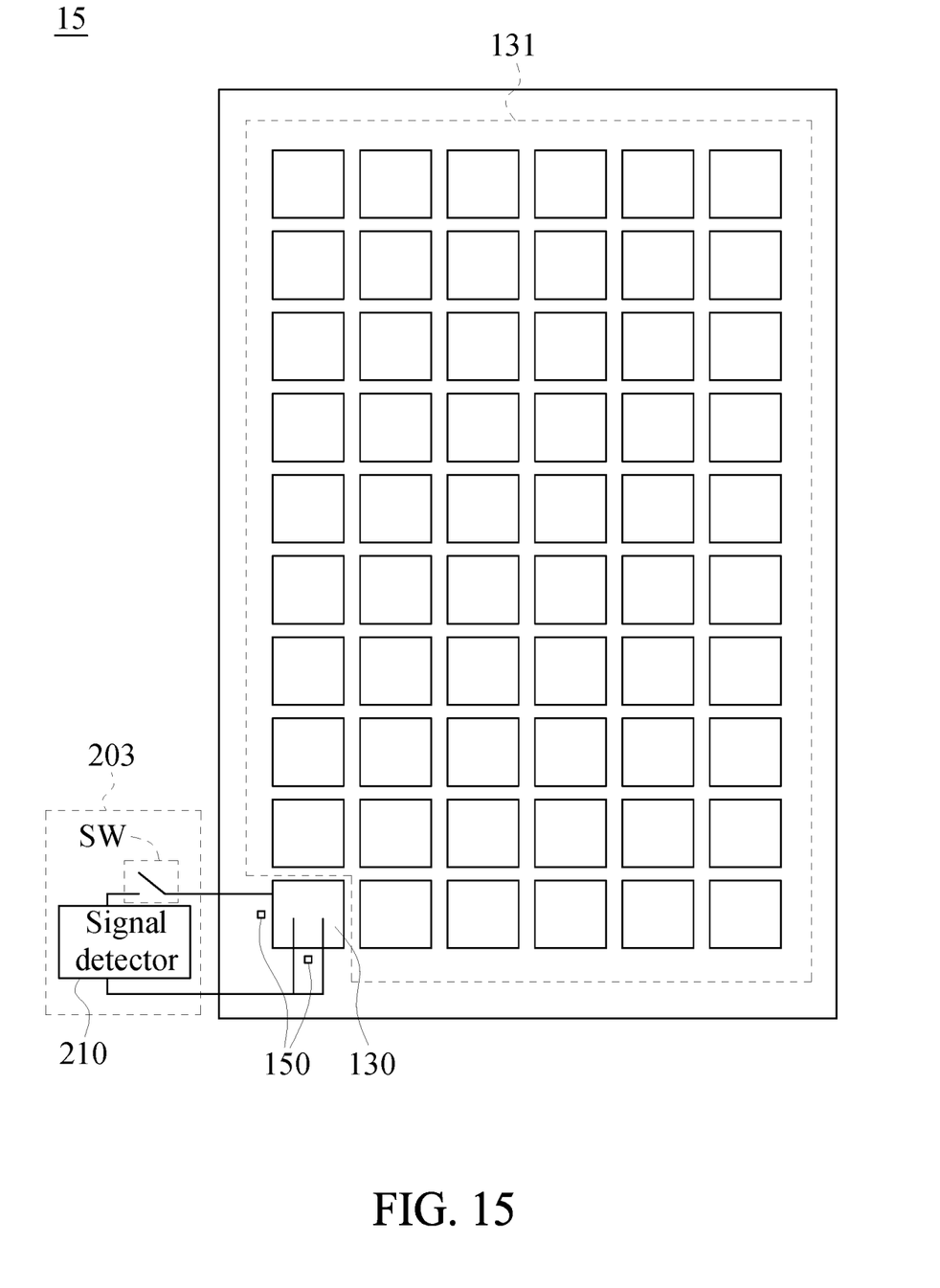
FIG. 15 is a schematic diagram illustrating an embodiment of a solar panel having a solar energy detection module.

Referring to FIG. 15, an embodiment of a solar panel 15 having a solar energy detection module is illustrated in a schematic diagram. The embodiment of the solar panel 15 includes a structure of the solar energy detection module 10 (or 11, 12, or 13) and a plurality of second photovoltaic units 131. The solar energy detection module 10 includes an encapsulation portion 100, a first photovoltaic unit 130, light sources 150, a transparent layer 170, as shown in FIG. 1. The second photovoltaic units 131 are disposed in the encapsulation portion 100, for example, between the first encapsulation layer 120 and the second encapsulation layer 160. The solar panel 15 may include a detection processing unit 203, which includes a signal detector 210 and a switch element SW. When the switch element SW is turned on, the signal detector 210 can generate an electrical signal by detecting the first photovoltaic unit 130. In addition, the detection processing unit 203 may be implemented as the above-mentioned detection processing unit 200, 200A, or other embodiment, so as to perform monitoring of surface shading level for the transparent layer or other monitoring.

Figure 16:
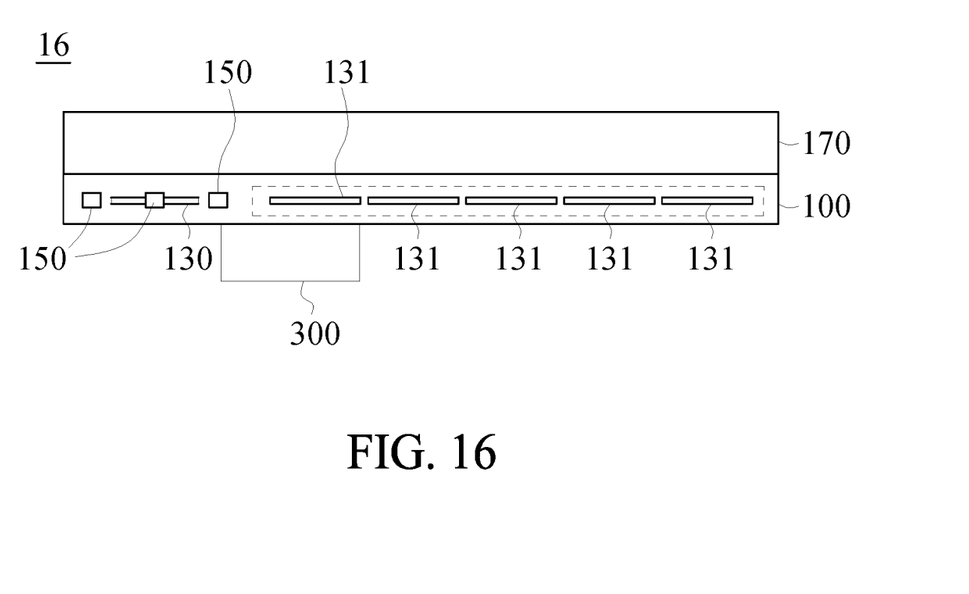
FIG. 16 is a schematic cross-sectional view illustrating an embodiment of a solar panel having a solar energy detection module.
Figure 17:
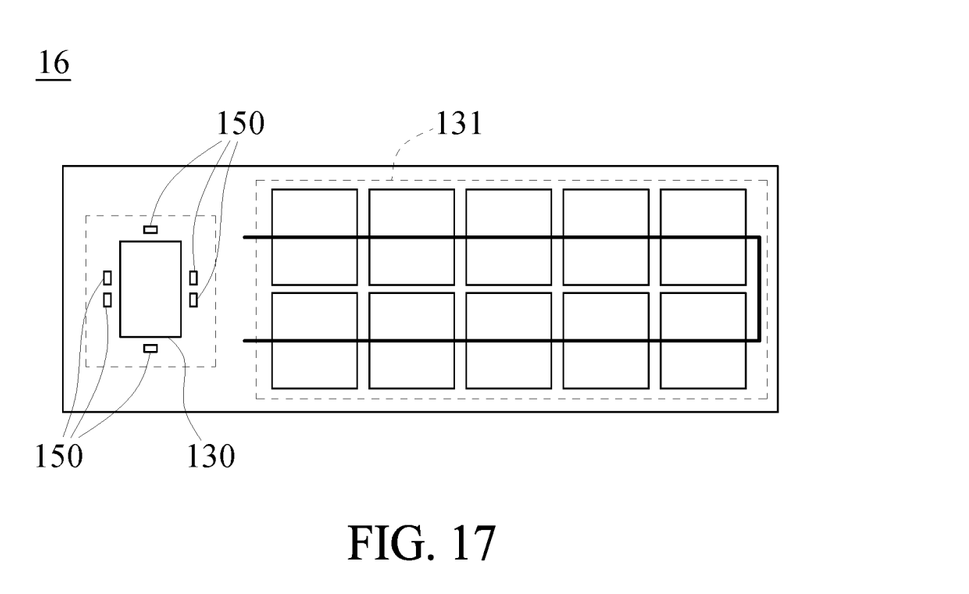
FIG. 17 is a schematic top view illustrating the internal structure of the solar panel of FIG. 16.

Referring to FIG. 16, an embodiment of a solar panel 16 having a solar energy detection module is illustrated in a schematic cross-sectional view. FIG. 17 is a schematic top view illustrating the internal structure of the solar panel of FIG. 16. As shown in FIG. 16 and FIG. 17, the embodiment of the solar panel 16 includes a structure similar to that of the solar energy detection module (such as 10, 11, 12 or 13) and a plurality of second photovoltaic units 131. The solar panel 16 includes an encapsulation portion 100, a first photovoltaic unit 130, a plurality of light sources 150, a plurality of second photovoltaic units 131, and a transparent layer 170. The first photovoltaic unit 130, the light sources 150, and the second photovoltaic units 131 are disposed within the encapsulation portion 100. For example, the encapsulation portion 100 includes a first encapsulation layer 120, a second encapsulation layer 160, and a backsheet 110, as shown in FIG. 1.

Figure 18:
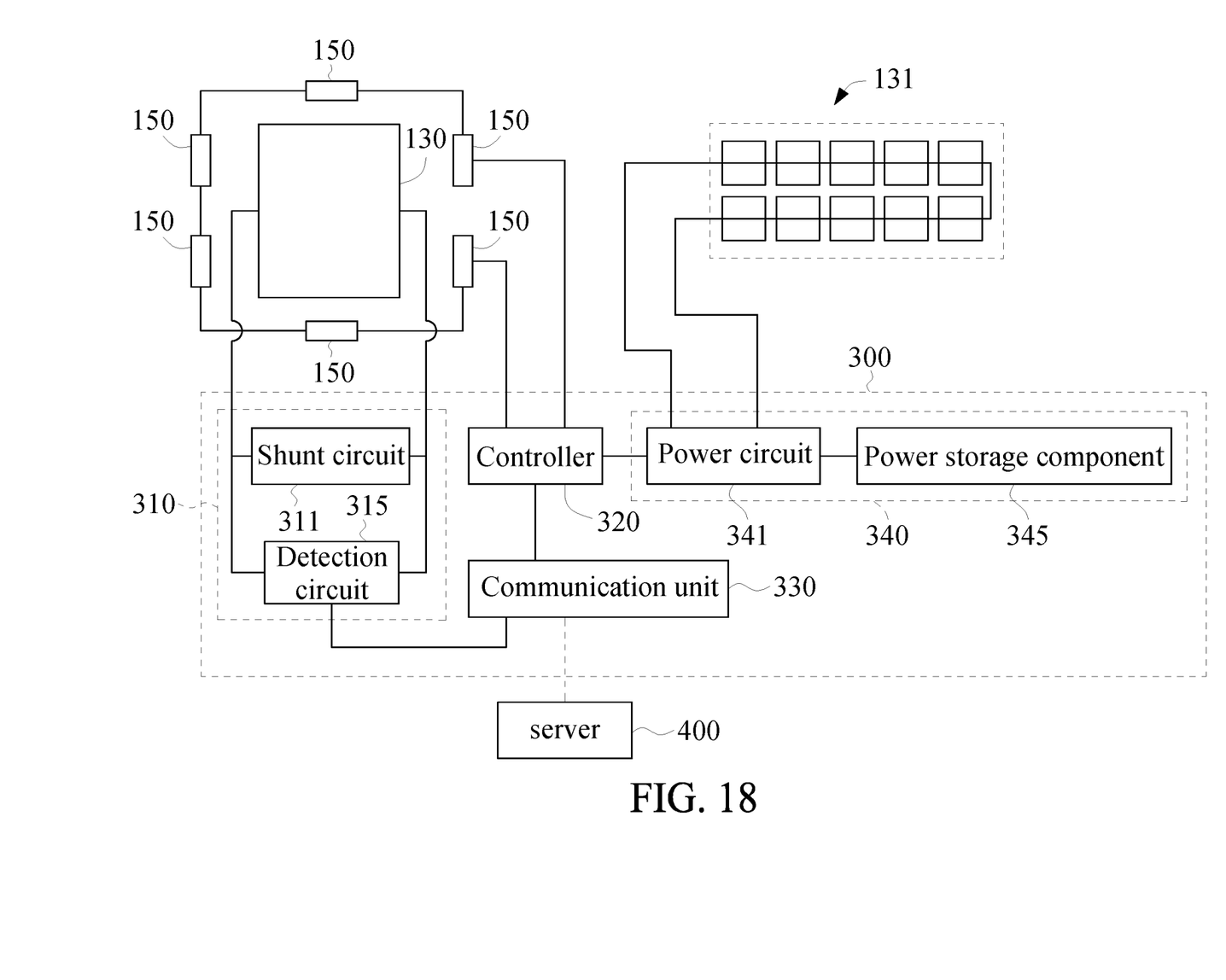
FIG. 18 is a schematic circuit diagram illustrating an embodiment of the solar panel of FIG. 16.

Referring to FIG. 18, an embodiment of the solar panel of FIG. 16 is illustrated in a schematic circuit diagram. As shown in FIG. 18, the detection processing unit 300 includes a signal detector 310, a controller 320, a communication unit 330, and a power storage unit 340. The signal detector 310, for example, includes a shunt circuit 311 and a detection circuit 315, wherein the shunt circuit 311 may be a shunt resistor, and the detection circuit 315 may be implemented by using a differential amplifier, a comparator or a current sense amplifier. The power storage unit 340, for example, includes a power circuit 341 and a power storage component 345. The power circuit 341 may utilize a transformer or voltage regulator circuit, and the power storage component 345 may be a rechargeable battery. The power circuit 341 can be employed to discharge or charge the power storage component 345, and power the controller 320 or other circuit, such as powering the communication unit 330. In addition, the detection processing unit 300 may further include a housing for the circuitry thereof to be disposed inside so as to provide protection against water and dust. However, the implementation of the invention is not limited to the above examples.

For example, the signal detector 310 is electrically coupled to the first photovoltaic unit 130 and is employed to detect the current of the first photovoltaic unit 130, such as a measurement range of current up to 250 mA (but not limited thereto). The first photovoltaic unit 130 may generate a maximum current depending upon some factors such as the area of the photovoltaic unit, the number of light sources, and/or other factor, such as a range from 50 mA to 10 A or other range; and thus the implementation of the invention is not limited to the above examples. The controller 320 is electrically coupled to the light sources 150 and is utilized to control the turning on or off of the light sources 150. In some embodiments, the controller 320 may be configured to control the light sources 150 to be turned on in a specified time or interval, or to control the light sources 150 to flash at a preset frequency. The signal outputted by the signal detector 310 to indicate the intensity of current, or the result of processing of the same signal by the controller 320, can be transmitted by using the communication unit 330 in a wired manner (such as a RS-485 communication interface, controller area network (CAN), or so on) or wireless manner (such as a wireless communication protocol, such as Bluetooth (BT), Bluetooth Low Energy (BLE), ZigBee low-power wide area network (LPWAN) or other). Accordingly, a signal related to a state of the solar energy detection module, such as a signal indicating a surface shading level of the transparent layer 170, can be transmitted to an external device, such as a server 400, so as to facilitate monitoring, logging or statistical computation in a remote side, wherein the server 400 is a computing device or a cloud server. For example, the detection processing unit 300 may be configured to measure the sunlight irradiance during the daytime while to turn on the light source 150 and detect the shading rate during the night. In addition, the external device, such as the server 400, can remotely transmit data or instructions to the communication unit 330 so as to configure the detection processing unit 300, e.g., the controller 320, thus realizing remote monitoring. However, the implementation of the invention is not limited to the above examples.

As disclosed above, each kind of the embodiments may be implemented as a solar energy detection module or a solar panel, which can utilize a structure with reduced complexity to provide detection, to perform monitoring for surface shading level of the transparent layer or other monitoring, so as to facilitate detection efficiency and reduce users' management burden. The solar energy detection module is suitable to be integrated with the solar panel for detection because the light source and photovoltaic unit of the solar energy detection module are encapsulated between the first encapsulation layer and second encapsulation layer. Hence, the light source and photovoltaic unit serving as a detection device can be completely integrated into the structure of the solar panel, so that it is unnecessary for the structure of the solar panel, as required in the conventional approach, to additionally provide a space for accommodating a detection device or to locally remove or omit a portion of active components from the structure of the solar panel so as to provide such an addition space. Thus, the whole structure of the solar panel, such as form factor thereof, can be simplified. In other words, for the design and manufacturing process of solar panels, a solar panel can be enabled to have detection functionality by utilizing a structure with reduced complexity according to an embodiment of the invention to perform monitoring for surface shading level of the transparent layer or other monitoring, so as to facilitate detection efficiency and reduce users' management burden. The overall costs of solar panel design and manufacturing process can be reduced accordingly.

In the description of this specification, the description of the terms "one embodiment," "some embodiments," "examples," "specific examples," or "some examples," and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

While the present disclosure has been described by means of specific embodiments, numerous modifications and variations could be made thereto by those skilled in the art without departing from the scope and spirit of the present disclosure set forth in the claims.

What is claimed is:

1. A solar energy detection module, comprising:
a backsheet;
a first encapsulation layer, disposed above the backsheet;
a first photovoltaic unit, disposed above the first encapsulation layer;
a light source, disposed above the first encapsulation layer;
a second encapsulation layer, disposed above the first photovoltaic unit and the light source; and
a transparent layer, disposed above the second encapsulation layer;
wherein the light source is configured to emit light toward the transparent layer;
the first photovoltaic unit is arranged to be able to receive light emitted from the light source; and
the first photovoltaic unit is utilized to generate an electrical signal indicating intensity of light that the first photovoltaic unit receives;
wherein the backsheet, the first encapsulation layer, the second encapsulation layer, and the transparent layer of the solar energy detection module is capable of being extended and are fully integrated into structure of a solar panel such that the light source and the first photovoltaic unit are encapsulated between the first encapsulation layer and the second encapsulation layer; and the first encapsulation layer and second encapsulation layer are used for a plurality of second photovoltaic units of the solar panel to be provided therebetween.

2. The solar energy detection module according to claim 1, wherein the light source is disposed beside at least one side of the first photovoltaic unit; the second encapsulation layer is disposed above the first encapsulation layer; the first photovoltaic unit and the light source are disposed underneath the second encapsulation layer.

3. The solar energy detection module according to claim 1, wherein number of the first photovoltaic unit is plural, the light source is disposed among the first photovoltaic units.

4. The solar energy detection module according to claim 1, wherein number of the light source is plural, the light sources are disposed beside at least two sides of the first photovoltaic unit.

5. The solar energy detection module according to claim 1, wherein when the light source is off, the first photovoltaic unit is utilized for generating an electrical signal indicating intensity of light from outside the solar energy detection module; when the light source is on, if a surface of the transparent layer is shaded by an external thing, the first photovoltaic unit is utilized for generating an electrical signal indicating intensity of light including light reflected or scattered by the external thing on the surface of the transparent layer.

6. The solar energy detection module according to claim 1, wherein the solar energy detection module further comprises:
a detection processing unit, electrically coupled to the first photovoltaic unit and the light source, for outputting a signal indicating a surface shading level of the transparent layer, based on the electrical signal generated by the first photovoltaic unit when the light source is on.

7. The solar energy detection module according to claim 1, wherein the solar energy detection module further comprises:
a detection processing unit, electrically coupled to the first photovoltaic unit and the light source, for controlling turning on or off of the light source, and for outputting a signal indicating a surface shading level of the transparent layer, based on the electrical signal generated by the first photovoltaic unit when the light source is on and the electrical signal generated by the first photovoltaic unit when the light source is off.

8. The solar energy detection module according to claim 7, wherein the detection processing unit further comprises:
a signal detector, electrically coupled to the first photovoltaic unit, for detecting the electrical signal generated by the first photovoltaic unit to output a detection signal accordingly; and
a controller, electrically coupled to the signal detector and the light source, wherein the controller is utilized for outputting a signal indicating a surface shading level of the transparent layer, based on the detection signal outputted by the signal detector when the light source is on and the detection signal generated by the signal detector when the light source is off.

9. The solar energy detection module according to claim 1, wherein the solar energy detection module further comprises:
a detection processing unit, electrically coupled to the first photovoltaic unit and the light source, for controlling turning on or off of the light source, and for obtaining a value indicating a surface shading level of the transparent layer, based on the electrical signal generated by the first photovoltaic unit when the light source is on and the electrical signal generated by the first photovoltaic unit when the light source is off;
wherein the detection processing unit determines an irradiance value based on the electrical signal generated by the first photovoltaic unit when the light source is off, wherein the detection processing unit further outputs an irradiance value for the transparent layer without surface shading, based on the irradiance value and the value of the surface shading level.

10. The solar energy detection module according to claim 1, wherein the solar energy detection module further comprises:
a calibration photovoltaic unit, disposed between the first encapsulation layer and the second encapsulation layer; and
a non-transparent layer, disposed above the calibration photovoltaic unit and arranged to reflect a portion of the light emitted by the light source toward the calibration photovoltaic unit;
wherein the calibration photovoltaic unit is utilized for generating an electrical signal indicating intensity of light received by the calibration photovoltaic unit.

11. The solar energy detection module according to claim 10, wherein the solar energy detection module further comprises:
a detection processing unit, electrically coupled to the first photovoltaic unit, the calibration photovoltaic unit and the light source, for controlling turning on or off of the light source, and for outputting a signal indicating a surface shading level of the transparent layer, based on the electrical signal generated by the first photovoltaic unit when the light source is on, the electrical signal generated by the calibration photovoltaic unit, and the electrical signal generated by the first photovoltaic unit when the light source is off.

12. The solar energy detection module according to claim 1, wherein the solar energy detection module further comprising:
   a power storage unit, electrically coupled to the first photovoltaic unit and the light source, for storing electricity generated by the first photovoltaic unit in a power storage mode, and providing electricity to the light source and the detection processing unit in a detection mode so as to output a signal indicating a surface shading level of the transparent layer.

13. A solar panel comprising:
   a solar energy detection module including:
      a backsheet;
      a first encapsulation layer, disposed above the backsheet;
      a first photovoltaic unit, disposed above the first encapsulation layer;
      a light source, disposed above the first encapsulation layer;
      a second encapsulation layer, disposed above the first photovoltaic unit and the light source; and
      a transparent layer, disposed above the second encapsulation layer;
      wherein the light source is configured to emit light toward the transparent layer; the first photovoltaic unit is arranged to be able to receive light emitted from the light source; and the first photovoltaic unit is utilized to generate an electrical signal indicating intensity of light that the first photovoltaic unit receives; and
   a plurality of second photovoltaic units, disposed between the first encapsulation layer and the second encapsulation layer;
      wherein the backsheet, the first encapsulation layer, the second encapsulation layer, and the transparent layer of the solar energy detection module extend and are fully integrated into structure of the solar panel such that the light source and the first photovoltaic unit are encapsulated between the first encapsulation layer and the second encapsulation layer; and the first encapsulation layer and second encapsulation layer are used for the plurality of second photovoltaic units of the solar panel to be provided therebetween.

* * * * *